United States Patent [19]

Flink et al.

[11] Patent Number: 4,481,478
[45] Date of Patent: Nov. 6, 1984

[54] DIFFERENTIAL AMPLIFIER HAVING A COMPENSATION CURRENT INJECTION SELECTOR NETWORK

[75] Inventors: John A. Flink, Santa Clara; Charles L. Vinn, Milpitas, both of Calif.

[73] Assignee: Raytheon Company, Lexington, Mass.

[21] Appl. No.: 452,683

[22] Filed: Dec. 23, 1982

[51] Int. Cl.$^3$ .............................................. H03F 3/45
[52] U.S. Cl. ...................................... 330/253; 330/261
[58] Field of Search ......................... 330/253, 259, 261

[56] References Cited

U.S. PATENT DOCUMENTS 3,622,902 11/1971 Thomas ............................... 330/253

Primary Examiner—James B. Mullins
Assistant Examiner—Steven J. Mottola
Attorney, Agent, or Firm—Richard M. Sharkansky; Joseph D. Pannone

[57] ABSTRACT

A differential amplifier is provided having a pair of input transistors with first electrodes connected to a first voltage potential through a first current source, a second pair of electrodes providing a pair of input terminals for the differential amplifier, and a third pair of electrodes connected to a pair of terminals, the current produced by the first current source passing through the first and third electrodes of the pair of input transistors into the pair of terminals in a ratio related to the difference in voltage of input signals fed to the pair of input terminals and the degree of mismatch in the pair of input transistors. A selector network injects a compensation current substantially equal to the difference in the currents passing through the pair of input transistors when the voltages at the pair of inputs are equal, and which results from a mismatch in such pair of input transistors, into a selected one of the pair of terminals. A balanced current mirror has an input coupled to a first one of the pair of terminals and an output coupled to a second one of the pair of terminals for forcing current passing into the second one of the pair of terminals through the output of the current mirror to be substantially equal to current passing into the first one of the pair of terminals to the input of the current mirror with an output current passing from the second one of the pair of terminals to an output stage, such output current being substantially zero when the voltages at the pair of input terminals are equal to thereby compensate for the difference in the currents passing through the pair of input transistors as a result of the mismatch in the pair of input transistors.

10 Claims, 2 Drawing Figures

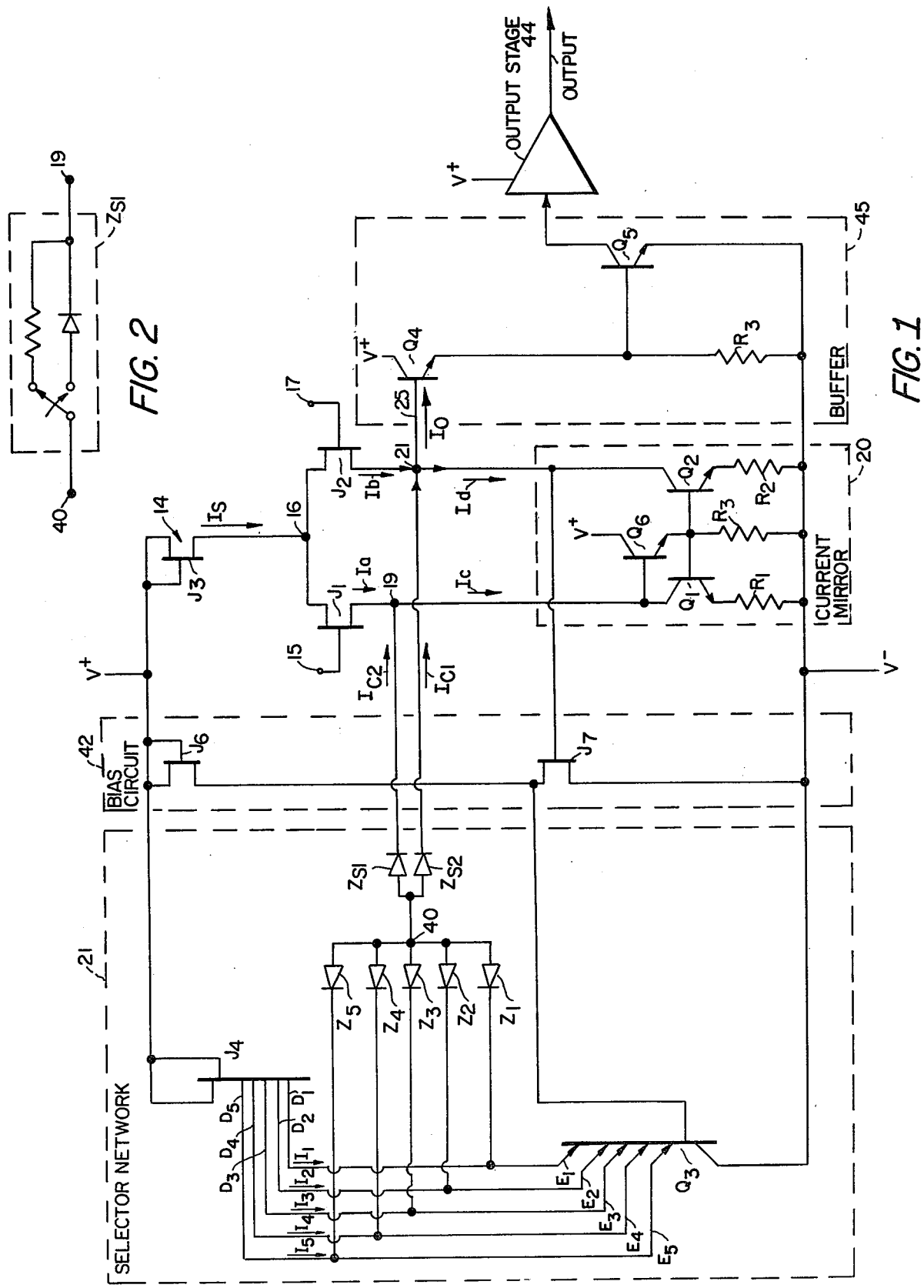

DIFFERENTIAL AMPLIFIER HAVING A COMPENSATION CURRENT INJECTION SELECTOR NETWORK

BACKGROUND OF THE INVENTION

This invention relates generally to differential amplifiers and more particularly to differential amplifiers having a pair of input transistors.

As is known in the art, differential amplifiers have been used in a wide variety of applications including use in the input stage of operational amplifiers. One such differential amplifier includes a pair of input transistors having first electrodes coupled to a common current source, second electrodes providing a pair of inputs for the differential amplifier, and third electrodes coupled either directly to passive resistive loads, or indirectly to such passive resistive loads through an active current mirror circuit to provide an output for the differential amplifier. Such differential amplifiers may include as the input transistors thereof either bipolar transistors or field effect transistors. When bipolar transistors are used, the base electrodes provide the pair of inputs for the differential amplifier with typically the emitter electrodes being connected to the common current source. When field effect transistors are used as the input transistors, the gate electrodes provide the pair of input electrodes and typically the source electrodes are connected to the common current source. In either case, when such differential amplifier is used as the input stage of an operational amplifier, mismatches in the voltages between the base and emitter electrodes (i.e. $V_{be}$) in the case of bipolar transistors or in the voltages between the gate and source electrodes (i.e. $V_{gs}$) in the case of field effect transistors, result in an undesirable temperature sensitive offset voltage being produced at the output of the operational amplifier (such offset voltage being defined as the voltage required at the pair of input terminals from a zero source impedance to drive the output voltage produced by the operational amplifier to zero volts). It is further noted that since the offset voltage is inversely related to the transconductance of the transistors and since the transconductance of field effect transistors is an order of magnitude lower than the transconductance of bipolar transistors, while it is important to reduce $V_{be}$ mismatches in bipolar transistors, it is even more critical to reduce the effect of mismatching in $V_{gs}$ in field effect transistors.

As is also known, the $V_{be}$ of a bipolar transistor is a function of the emitter area and doping concentration while the $V_{gs}$ of a field effect transistor is a function of gate channel dimensions and doping concentration. Thus, during wafer fabrication, emitter areas, channel dimensions and doping concentrations are controlled and are matched for the pair of input transistors as far as possible to provide a pair of matched input transistors. However, despite this fabrication process control the input transistors may have dimensions and/or doping concentration mismatches. Various techniques suggested to compensate for these fabrication process mismatches include the injecting of a compensating current directly into the passive resistive loads so that the voltages at the outputs of the differential amplifier are equal at the quiescent operating point, i.e. when both transistors pass equal amounts of current produced by the current source. With one technique, a pair of current sources are provided to inject compensating currents into both passive resistive loads, the amount of current injected into each one of the loads being adjusted by trimmable resistors. While such technique may be useful in some applications, imbalances in the compensating currents over the operating range of temperatures because of temperature changes in the trimmed resistors will generally result in concomitant imbalances over the operating range of temperatures. In other one of such techniques, here when an active current mirror is used between the pair of resistive loads and the outputs of the differential amplifier, a single compensating current is injected directly into one of the passive resistive loads. With such arrangement, because the injected current introduces an error in the match of the currents in the current mirror and while balanced at one temperature the balance is not maintained over a relatively wide range of operating temperatures. Thus, the control circuit suggested to direct the injected amount to the proper one of the pair of resistive loads causes an error uncertainty and imbalance of the desired balanced current mirror transistors over a wide range of temperatures.

SUMMARY OF THE INVENTION

In accordance with the present invention, a differential amplifier is provided having: a pair of input transistors with first electrodes connected to a first voltage potential through a first current source, a second pair of electrodes providing a pair of input terminals for the differential amplifier, and a third pair of electrodes connected to a pair of terminals, the current produced by the first current source passing through the first and third electrodes of the pair of input transistors into the pair of terminals in a ratio related to the difference in voltage of input signals fed to the pair of input terminals and the degree of mismatch in the pair of input transistors. A selector network injects a compensation current substantially equal to the difference in the currents passing through the pair of input transistors when the voltages at the pair of inputs are equal, and which results from a mismatch in such pair of input transistors, into a selected one of the pair of terminals. A balanced current mirror has an input coupled to a first one of the pair of terminals and an output coupled to a second one of the pair of terminals for forcing current passing into the second one of the pair of terminals through the output of the current mirror to be substantially equal to current passing into the first one of the pair of terminals to the input of the current mirror with an output current passing from the second one of the pair of terminals to an output stage, such output current being substantially zero when the voltages at the pair of input terminals are equal to thereby compensate for the difference in the currents passing through the pair of input transistors as a result of the mismatch in the pair of input transistors.

In a preferred embodiment of the invention, the selector network includes: a plurality of additional current sources, each one thereof being matched, over a predetermined range of operating temperatures, to the first current source; and means, fed by the plurality of additional current sources for passing a selected portion of the current produced by the additional current sources to a selected one of the pair of outputs as the compensating current and for diverting the remaining unselected portion of the total current produced by the plurality of additional current sources form the pair of outputs to the second voltage potential. The current mirror includes a pair of bipolar transistors with collector electrodes thereof coupled to the pair of outputs, base electrodes connected together and emitter electrodes coupled to the second voltage potential. The selector network includes a transistor having: a plurality of input electrodes coupled to the plurality of additional current sources and, a selected one, or ones thereof, coupled to a selected one of the pair of outputs; a second electrode coupled to the second voltage potential; and a third electrode coupled to the second one of the pair of outputs through a bias circuit. The bias circuit provides a bias voltage between the second and third electrodes of the transistor of the selector network to inhibit current from the selected portion of the total current produced by the plurality of circuit sources from passing through such transistor and for allowing the remaining unselected portion of such total current to pass through the first and third electrodes of such transistor to the second voltage potential.

BRIEF DESCRIPTION OF THE DRAWING

The aforementioned aspects and other features of the invention are explained in the following description taken in connection with the accompanying drawing in which:

FIG. 1 is a schematic diagram of an operational amplifier according to the invention; and FIG. 2 is an equivalent circuit representation of a Zener diode used in the operational amplifier of FIG. 1.

DESCRIPTION OF THE PREFERRED EMBODIMENT

Referring now to FIG. 1, an operational amplifier 10 is shown to include in the differential amplifier input stage 12. The differential amplifier input stage 12 includes a pair of input transistors, here junction field effect (JFET) transistors $J_1$, $J_2$ having source electrodes thereof connected to a first voltage potential source $V+$ through a current source 14. The current source 14 includes a junction field effect transistor $J_3$, having the gate and source electrodes thereof connected together and to the first voltage source $V+$ with the drain electrode thereof being connected to the source electrodes of transistors $J_1$, $J_2$ at terminal 16, as shown. The gate electrodes of input JFET's $J_1$, $J_2$ provide a pair of inputs 15, 17 for the operational amplifier 10. The drain electrodes of the pair of input JFET's $J_1$, $J_2$ are connected to a pair of output terminals 19, 21 for the differential amplifier input stage 12. A current mirror 20 is coupled betweenn the pair of output terminals 19, 21 and a second voltage potential source $-V$, as shown. The current mirror 20 has an input coupled to one of the pair of output terminals 21, 19 here to output terminal 21 of the differential amplifier 12, as shown and an output 24 coupled to output terminal 21 of the differential amplifier 12, as shown. More particularly, the current mirror 20 includes a pair of matched bipolar transistors $Q_1$, $Q_2$ having collector electrodes connected to outputs 19, 21, respectively, as shown. The emitter electrodes of the pair of transistors $Q_1$, $Q_2$ are connected to the second voltage source $V-$ through a pair of resistive loads, here matched equal valued resistors $R_1$, $R_2$, as shown. The base electrodes of transistors $Q_1$, $Q_2$ are connected together, as shown and to the emitter of transistor $Q_6$, as shown and to the second voltage source V- through resistor $R_3$, as shown. Current mirror 20 hence forces the current passing from terminal 21 into the collector electrode of transistor $Q_2$ (i.e. the current $I_d$) to be substantially equal to the current passing from terminal 19 into the collector electrode of transistor $Q_1$ (i.e. the current $I_c$). The base electrode of transistor $Q_6$ is connected tothe collector electrode of transistor $Q_1$ and the collector electrode of transistor $Q_6$ is connected to the $+V$ sources, as shown.

A selector network 21 is provided. Such network 21 includes a plurality of, here five, current sources $I_1$ to $I_5$ provided by a junction field effect transistor $J_4$, such transistor $J_4$ having a plurality of drain electrodes $D_1$ to $D_5$, respectively formed with different areas. The areas of the drain regions of field effect transistor $J_4$ are scaled in successive 2:1 ratios so that the area of the drain region designated $D_2$ is twice the area of the drain region $D_1$. Likewise, drains $D_3$, $D_4$, $D_5$ have drain areas four times, eight times, and sixteen times larger, respectively than the drain region of drain $D_1$. The gate and source electrode of transistor $J_4$ are connected together and to the first voltage source $V+$, as shown. It is also noted that the field effect transistor $J_4$ is thermally and physically matched to field effect transistor $J_3$ so that if the drain current of transistor $J_3$ is designated as $I_s$, the currents $I_1$ to $I_5$ through drains $D_1$, $D_2$, $D_3$, $D_4$, $D_5$ may be represented as $AI_s$, $2AI_s$, $4AI_s$, $8AI_s$ and $16AI_s$, respectively where A is a constant less than one, here A is one hundredth (0.01).

The selector network 21 is provided to selectively couple the current produced by one or more of the plurality of current sources $I_1$ to $I_r$ as a compensating current to a selected one of the output terminals 19, 21 of the differential amplifier 12 for reasons to be described in detail hereinafter. Suffice it to say here, however, that the selector network 21 includes a plurality of Zener diodes $Z_1$ to $Z_5$ having cathodes thereof connected to corresponding ones of the drain electrodes $D_1$ to $D_5$ of field effect transistor $J_4$. The anodes of the Zener diodes $Z_1$ to $Z_5$ are connected together at a common terminal 40, as shown. The anode electrodes of a pair of Zener diodes $Z_{s1}$, $Z_{s2}$ are connected together at terminal 40. The cathodes of Zener diodes $Z_{s1}$, $Z_{s2}$ are connected to the output terminals 19, 21, respectively, as shown. A multi-emitter, PNP bipolar transistor $Q_3$, has the emitter electrodes $E_1$ to $E_5$ thereof connected to corresponding ones of the plurality of current sources $I_1$ to $I_5$, respectively, and more particularly to the drain electrodes $D_1$ to $D_5$, respectively, of the field effect transistor $J_4$. The collector electrode of transistor $Q_3$ is connected to the second voltage source $V-$, as shown. The base electrode of transistor $Q_3$ is connected to a bias circuit 42, as shown. The bias circuit 42 includes a pair of matched field effect transistors $J_6$, $J_7$ having source and drain electrodes serially connected between the first voltage source $V+$ and the second voltage source $V-$, as shown. It is noted that the gate electrode of transistor $J_6$ is connected to the source electrode thereof and that the gate electrode of transistor $J_7$ is connected to the output 24 of the current mirror 20, i.e. to the collector electrode of transistor $Q_2$. The source electrode of transistor $J_7$ provides a bias voltage for transistor $Q_3$ and such source electrode of transistor $J_7$, in addition to being connected to the drain electrode of transistor $J_6$, is connected to the base electrode of transistor $Q_3$, as shown. Completing the operational amplifier 10, an output stage 44 is coupled to the output terminal 21 via a buffer 45 in a conventional manner. Here, the output terminal 24 is coupled to the base of transistor $Q_4$ through output line 24. The collector of transistor $Q_4$ is coupled to the $V+$ source and the emitter of transistor $Q_4$ is coupled to ground through resistor $R_3$.

A grounded emitter transistor $Q_5$ has its base connected to the emitter of transistor $Q_4$ and its collector to current output stage 44, as shown. The output stage includes biasing circuitry fed by the $+V$ source, as indicated.

In order to compensate for any mismatch between the gate-to-source voltages $V_{gs}$ of the input junction field effect transistors $J_1$, $J_2$, the selector network 21 injects into one of the output terminals 19, 21 a compensating current. The magnitude of this compensating current is substantially equal to the difference in current flowing through JFET's $J_1$, $J_2$ when the voltages fed to the inputs 15, 17 are equal to each other. Thus, the compensating current is substantially equal to the difference in currents passing through the input JFET's $J_1$, $J_2$ as a result of their $V_{gs}$ mismatch. More particularly, if the current into output terminal 19 from JFET $J_1$ is designated $I_a$, and the current into output terminal 21 from JFET $J_2$ is designated $I_b$, it follows that at the quiescent operating point when the voltage at input 15 is equal to the voltage at input 17, $I_a$ will equal $I_b$ if the JFET's $J_1$, $J_2$ are matched with equal $V_{gs}$; however, in the the practical case the $V_{gs}$ of the transistors $J_1$, $J_2$ will not be equal and hence at this quiescent operating point $I_a \neq I_b$. In the absence of a compensating current being supplied from selector network 21, the current $I_a$ will flow out of output terminal 19 into the collector of transistor $Q_1$ and $I_a$ will be equal to $I_c$. Because of the transistors $Q_1$, $Q_2$ of current mirror 20, the current $I_c$ passing out of output terminal 21 and into the collector of transistor $Q_2$ will equal the current $I_d$. Further, the current passing out of output terminal 21 will be equal to the current $I_b$ passing into output terminal 21. Hence, since the output current $I_0$ through output line 25 is equal to $I_d - I_b$ and since because of the current mirror 20 $I_d = I_c$ where $I_c = I_a$, it follows that the output current will be equal to $I_0 = I_b - I_a$ thus producing an erroneous output voltage for the operational amplifier. Here, however, a compensating current is formed by short circuiting a selected one or ones of the Zener diodes $Z_1$ to $Z_5$ so that a proper portion (substantially equal to $|I_a - I_b|$) of the total current produced by the plurality of current sources $I_1$ to $I_5$ flows into terminal 40. It is noted that because there are only a finite number of current sources, here five current sources $I_1$ to $I_5$, available to form the magnitude of the compensating current, a finite error will result, the magnitude of the error being related to the number of current sources being provided. The short circuiting of a Zener diode is performed by applying a voltage of proper magnitude and polarity across the anode and cathode of the diode to be short circuited from an external voltage source, not shown. This process is described in an article entitled "A Precision Trim Technique for Monolithic Analog Circuits" by George Erdi, published in *IEEE Journal of Solid-State Circuits,* Vol. SC-10, No. 6, Dec.1975, Pages 412 to 416. Thus, the diodes $Z_1$ to $Z_5$, $Z_{s1}$, $Z_{s2}$ may be represented as a switch, a relatively small resistance resistor and diode as shown in FIG. 2 for an exemplary one of the diodes, here Zener diode $Z_{s1}$. This compensating current is then steered to a selected one of the output terminals 19, 21 by short circuiting a selected one of the Zener diodes $Z_{s1}$, $Z_{s2}$. If diode $Z_{s1}$ is shorted, the compensating current designated $I_{c2}$ is fed into output terminal 19 whereas if diode $Z_{s2}$ is shorted, the compensating current designated $I_{c1}$ is fed into output terminal 21. Thus, the proper amount of compensating current is steered into output terminal 19 or output terminal 21 so that at the quiescent operating point when the voltage at input 15 equals the voltage at input 17, the output current $I_0$ will be substantially zero even though the $V_{gs}$ of JFET $J_1$ does not equal the $V_{gs}$ of JFET $J_2$. That is, if $I_a$ is greater than $I_b$, the compensating current $I_{c1} = I_a - I_b$ is injected into output terminal 21 by short circuiting Zener diode $Z_{s2}$ whereas if $I_b$ is greater than $I_a$, the compensating current $I_{c2} = I_b - I_a$ is injected into output terminal 19 by short circuiting Zener diode $Z_{s1}$. Thus, if $I_a > I_b$, $I_c = I_a$, $I_d = I_b + I_{c1}$, and since the current mirror forces $I_d = I_c$, it follows that $I_0 = (I_b - I_a) + I_{c1}$. But, since $I_{c1} = I_a - I_b$, $I_0$ is zero. Likewise, if $I_b > I_a$, $I_c = I_a + I_{c2}$, $I_d = I_b$, and since the current mirror forces $I_c = I_d$, it follows that $I_0 = I_b - (I_a + I_{c2})$, but since $I_{c2} = I_{bc} - I_a$, $I_0$ is zero. In any event, the current mirror 20 substantially equalizes the currents $I_c$, $I_d$, passing out of the output terminals 19, 20 so that $I_c = I_d$ when the voltages at the input terminals are equal, in which case $I_0$ will be substantially zero. In this way, any imbalance in the voltage between the gate and source electrodes of field effect transistors J1, J2 are compensated, and $I_0$ will be substantially zero when the voltages at inputs 15, 17 are equal. It is noted that since resistors $R_1$ and $R_2$ are matched and since the transistors $Q_1$, $Q_2$ are matched, the current mirror 20 is a balanced current mirror and thereby provides temperature tracking over the operating range of temperatures. It is further noted that the remaining portion of the current produced by the plurality of current sources $I_1$ to $I_5$ which does not form a portion of the compensating current is diverted from the current mirror 12 and passes through the bipolar transistor $Q_3$ to the second voltage source $V-$. In order to ensure that this unused remaining portion of the current produced by the plurality of current sources $I_1$ to $I_5$ is diverted from the current mirror 20, a proper bias voltage is applied to the base electrode of transistor $Q_3$. To provide this assurance, it is noted that current fed to an emitter of transistor $Q_3$ will pass to the collector of such transistor $Q_3$ if the emitter of such transistor $Q_3$ is at a more positive voltage than the base of such transistor $Q_3$. Thus, it is noted that when a selected one of the Zener diodes $Z_1$ to $Z_5$ is short circuited and a selected one of the Zener diodes $Z_{s1}$, $Z_{s2}$ is shorted, the voltage at the collector electrode of the one of the transistors $Q_1$, $Q_2$ being fed the compensating current, appears at the emitter electrode of transistor $Q_3$ connected to such shorted one of the diodes $Z_1$ to $Z_5$, $Z_{s1}$, $Z_{s2}$. Therefore, since transistors $J_6$ and $J_7$ are matched, and since the voltage between the gate and source electrodes of transistor $J_6$ is zero, the voltage at the source electrode of transistor $J_7$, and hence the voltage at the base electrode of transistor $Q_3$, will be equal to the voltage at the collector electrode of the one of the transistors $Q_1$, $Q_2$ being fed the compensating current. Therefore, the voltage at the base electrode of transistor $Q_3$ will be equal to the voltage at the one of the emitter electrodes of such transistor $Q_3$ connected to the shorted Zener one of the Zener diodes $Z_1$ to $Z_5$. For example, if Zener diodes $Z_1$ and $Z_3$ are shorted, a compensating current $(I_5 + 4I_s)$ passes to terminal 40. If Zener diode $Z_{s2}$ is shorted, the voltage at the collector electrode of transistor $Q_2$ appears at emitters $E_1$ and $E_3$ of transistor $Q_3$ and such voltage also appears at the base of transistor $Q_3$. Thus, since the voltage at the base of transistor $Q_3$ will be equal to the voltage at emitters $E_1$ and $E_3$ and circuits $I_1$, $I_5$ will not pass through transistor $Q_3$ but rather will provide the desired compensating current by passing to terminal 40.

It is noted, however, that emitter $E_2$, $E_4$ and $E_5$ will be at a more positive potential than the potential at the base of such transistor because the Zener breakdown voltage is greater than the base-emitter voltage drop produced across the base-emitter junction of transistor $Q_3$. That is, the voltages on the emitter $E_2$, $E_4$ and $E_5$ will rise until either transistor $Q_3$ conducts or Zener $Z_3$ conducts. Transistor $Q_3$ will conduct when the voltages at the emitters $E_2$, $E_4$ and $E_5$ are one $V_{be}$ (i.e. one base to emitter voltage drop, $V_{be}$) higher than the voltage at the base electrode of transistor $Q_3$, whereas the Zener diode $Z_3$ will conduct when the voltage between the voltage at the emitter $E_2$ and terminal 40 is greater than the Zener breakdown voltage of diode $Z_3$. Since the Zener breakdown voltage of diodes $Z_1$ to $Z_5$ are much greater than the one $V_{be}$, transistor $Q_3$ will conduct, and hence currents $I_2$, $I_4$ and $I_5$ will pass through the collector and emitter electrodes of transistor $Q_3$ to the second potential voltage source $V-$ and will thereby be diverted from the current mirror 20. On the other hand, if Zener diode $Z_{s1}$ were shorted rather than Zener $Z_{s2}$, the voltage at the emitters $E_1$ and $E_3$ would be equal to the voltage at the collector of transistor $Q_1$ while the base of transistor $Q_3$ would be at the voltage at the collector of transistor $Q_2$. It is also noted that the voltage at the collector of transistor $Q_2$ will be equal to the $V-+(V_{beQ5}+V_{beQ4})$ where $V-$ is the voltage of the second voltage potential, $V_{beQ5}$ is the voltage across the base-emitter junction of transistor $Q_5$ and $V_{beQ4}$ is the voltage across the base-emitter junction of transistor $Q_4$. Also, the voltage at the collector electrode of transistor $Q_1$ is equal to $V-+(V_{beQ2}+I_eR_2+V_{beQ6})$, where $V_{beQ2}$ is the voltage across the base-emitter junction of transistor $Q_2$, $I_e$ is the current through resistor $R_2$ (assuming negligible base current for transistor $Q_2$) and $V_{beQ6}$ is the voltage across the base-emitter junction of transistor $Q_6$. Here, $V_{beQ5}=V_{beQ4}=V_{beQ2}=V_{beQ6}$ and $I_eR_2<<V_{beQ5}$, so that under this condition the voltage at the collector electrode of transistor $Q_1$ is equal to the voltage at the collector of transistor $Q_2$ and hence currents $I_1$ and $I_3$ are inhibited from flowing through transistor $Q_3$ and are diverted to terminal 40 while currents $I_2$, $I_4$ and $I_5$ pass through transistor $Q_3$ to the second potential source $V-$ and are diverted from terminal 40.

It should be noted that with the compensation circuit described, the current mirror remains balanced and the bias circuit 42 ensures that the compensation current passes to the current mirror with the remaining current being diverted from the current mirror.

Having described a preferred embodiment of the invention, it is now evident that other embodiments incorporating these concepts may be used. It is felt, therefore, that this invention should not be restricted to the disclosed embodiment but rather should be limited only by the spirit and scope of the appended claims.

What is claimed is:

1. A differential amplifier comprising:
    (a) means, including a pair of transistors having first electrodes adapted for coupling to a first current source, a pair of input electrodes, and a pair of output electrodes coupled to a pair of output terminals, for feeding a pair of currents to the pair of output terminals from the first current source in a ratio related to the difference in voltages of input signals fed to the pair of input electrodes, such pair of currents having a difference D therebetween when the voltages at the pair of inputs are equal;
    (b) a selector network means for adding a compensating current substantially equal to the difference D to the current fed to one of the pair of output terminals; and
    (c) means coupled to the pair of output terminals for equalizing the currents passing from the pair of output terminals producing an output current substantially zero when the voltages fed to the pair of input electrodes are equal to compensate for the difference D in the pair of currents passing through the pair of input transistors when such voltages are equal.

2. The amplifier recited in claim 1 wherein the selector network means includes: a plurality of additional current sources, each one thereof being matched over a predetermined range of operating temperatures, to the first current source; and means fed by the plurality of additional current sources, for passing a selected portion of the current produced by the additional current sources to the selected one of the pair of outputs as the compensating current and for diverting the remaining unselected portion of the total current produced by the plurality of additional current sources from the pair of outputs to a second voltage potential.

3. The amplifier recited in claim 2 wherein the equalizing means includes a pair of bipolar transistors with collector electrodes coupled to the pair of outputs, base electrodes coupled together and emitter electrodes coupled to the second voltage potential.

4. The amplifier recited in claim 3 wherein the selector means includes a transistor having: a plurality of input electrodes coupled to the plurality of additional current sources, and a selected one, or ones thereof coupled to a selected one of the pair of outputs; a second electrode coupled to the second voltage potential; and a third electrode coupled to the second one of the pair of outputs through a bias circuit.

5. The amplifier recited in claim 4 wherein the bias circuit includes means for providing a bias voltage between the second and third electrodes of the transistor of the selector network, means to inhibit current from the selected portion of the total current produced by the plurality of current sources from passing through such transistor and for allowing the remaining unselected portion of such total current to pass through the first and third electrodes of such transistor to the second voltage potential.

6. The amplifier recited in claim 5 wherein the transistor of the selector means is a bipolar transistor and wherein the second and third electrodes are base and collector electrodes, respectively.

7. The amplifier recited in claim 6 wherein the bias circuit includes a pair of transistors having first and second electrodes serially connected between the first and second voltage potentials.

8. The amplifier recited in claim 7 wherein a first one of the pair of transistors of the bias circuit has a third electrode coupled to the first voltage potential and a second one of the pair of transistors of the bias circuit has a third electrode coupled to the second one of the pair of outputs and the first electrode coupled to the base electrode of the bipolar transistor of the selector network means.

9. The amplifier recited in claim 8 wherein the input electrodes of the transistor of the selector means are emitter electrodes.

10. A differential amplifier comprising:

(a) means, including a pair of transistors having first electrodes adapted for coupling to a first current source, a pair of input electrodes, and a pair of output electrodes coupled to a pair of output terminals, for feeding a pair of currents to the pair of output terminals from the first current source in a ratio related to the difference in voltages of input signals fed to the pair of input electrodes, such pair of currents having a difference D therebetween when the voltages at the pair of inputs are equal;

(b) a selector network means for adding a compensating current substantially equal to the difference D to the current fed to one of the pair of output terminals; and (c) means having an input coupled to a first one of a pair of the output terminals and an output coupled to a second one of the pair of output terminals at a junction, for equalizing the current passing from the first one of the pair of output terminals to the input of the equalizing means and a current passing from the junction to the output of the equalizing means producing a current out of the junction equal to the difference between the current passing out of the pair of output terminals to the junction and the current passing from the junction to the output of the equalizing means, such current being substantially zero when the voltages fed to the pair of input electrodes are equal to compensate for the difference D in the pair of current passing through the pair of input transistors when such voltages are equal.

* * * * *

UNITED STATES PATENT OFFICE
CERTIFICATE OF CORRECTION

Patent No. 4,481,478          Dated  November 6, 1984

Inventor(s) John A. Flink and Charles L. Vinn

It is certified that error appears in the above-identified patent and that said Letters Patent are hereby corrected as shown below:

Column 2, Line 66:    Change "form" to --from--;

Column 3, Line 49:    Change "betweenn" to --between--,

Column 4, Line 3:     Change "tothe" to --to the--;

Column 4, Line 23:    Change "2AI $_s$," to --2AI$_s$,--;

Column 4, Line 28:    Change "I$_r$" to --I$_s$--;

Column 6, Line 15:    Change "I$_c$ $^2$ = I$_{bc}$ - I$_a$" to $$--I_c^2 = I_b - I_a--.$$

Signed and Sealed this

Twentieth Day of August 1985

[SEAL]

Attest:

DONALD J. QUIGG

Attesting Officer          Acting Commissioner of Patents and Trademarks